United States Patent [19]

Calhoun et al.

[11] Patent Number: 5,240,761

[45] Date of Patent: Aug. 31, 1993

[54] ELECTRICALLY CONDUCTIVE ADHESIVE TAPE

[75] Inventors: Clyde D. Calhoun; Maurice J. Fleming, both of St. Paul, Minn.

[73] Assignee: Minnesota Mining and Manufacturing Company, St. Paul, Minn.

[21] Appl. No.: 237,546

[22] Filed: Aug. 29, 1988

[51] Int. Cl.$^5$ .............................. C09J 7/02; C09J 9/02
[52] U.S. Cl. ........................ 428/148; 428/164; 428/328; 428/330; 428/343; 428/355; 428/356
[58] Field of Search ............... 428/148, 164, 208, 328, 428/330, 356, 343, 355; 174/117 A, 117 F, 117 FF; 427/174, 171

[56] References Cited

U.S. PATENT DOCUMENTS

| | | | |
|---|---|---|---|
| 3,475,213 | 10/1969 | Stow | 174/117 A |
| 4,113,981 | 9/1978 | Fujita et al. | 174/94 R |
| 4,258,100 | 3/1981 | Fujitani et al. | 428/328 |
| 4,447,492 | 5/1984 | McKavoney | 428/328 |
| 4,548,862 | 10/1985 | Hortman | 428/356 |
| 4,568,602 | 2/1986 | Stow | 428/355 |
| 4,606,962 | 8/1986 | Reybk et al. | 428/148 |
| 4,644,101 | 2/1987 | Jin | 428/900 |
| 4,735,847 | 4/1988 | Fujiwora et al. | 428/356 |
| 4,737,112 | 4/1988 | Jin et al. | 439/66 |

FOREIGN PATENT DOCUMENTS 1169946 11/1969 United Kingdom.
1331744 9/1973 United Kingdom.

Primary Examiner—Jenna L. Davis
Attorney, Agent, or Firm—Gary L. Griswold; Walter N. Kirn; Darla P. Neaveill

[57] ABSTRACT

Electrically conductive elements on two substrates can be electrically interconnected by an adhesive tape containing electrically conductive particles, most of which are substantially uniformly spaced from their six nearest neighbors. Preferably the particles are spherical and of substantially equal diameter slightly exceeding the thickness of the adhesive layer. The adhesive tape can be made by forming a dense monolayer of the particles, covering a stretchable adhesive layer with that dense monolayer, biaxially stretching the adhesive layer to separate each particle from other particles of the monolayer, and then embedding the particles either into that adhesive layer or into the adhesive layer of another tape.

11 Claims, 2 Drawing Sheets

ELECTRICALLY CONDUCTIVE ADHESIVE TAPE

BACKGROUND OF THE INVENTION

1. Field of the Invention

The invention concerns adhesive tape, the adhesive layer of which contains particles affording electrical conductivity through the thickness of the layer while being electrically insulating in lateral directions.

2. Description of the Related Art

As is pointed out in U.S. Pat. No. 4,548,862 (Hartman): "Modern electronic devices are becoming so small and their electrical terminals are so delicate and closely spaced that it is difficult and expensive to make electrical connections by soldering or other established techniques. U.S. Pat. No. 4,113,981 (Fujita et al.) uses an adhesive layer for individually electrically interconnecting multiple pairs of arrayed electrodes. The adhesive layer includes spherical electrically conductive particles of substantially the same thickness as the adhesive, thus providing a conductive path through each particle that bridges facing pairs of electrodes. The particles are randomly distributed throughout the adhesive layer, but the Fujita patent indicates that if the particles comprise less than 30% by volume of the layer, they will be sufficiently spaced so that the intervening adhesive will insulate against short circuiting between laterally adjacent electrodes. Carbon powder, SiC powder and metal powder are said to be useful.

"U.S. Pat. No. 3,475,213 (Stow) discloses a tape having an electrically conductive backing and a pressure-sensitive adhesive layer which contains a monolayer of electrically conductive particles that could be identical to the adhesive layer of the Fujita patent if Fujita were to use a pressure-sensitive adhesive" (col. 1, lines 15-38 of the Hartman patent). The Stow patent says that the particles should "have a substantial thickness slightly less than the thickness of the adhesive film" (col. 3, lines 1-2), and "essentially none of the particles should extend above the surface of the adhesive to preserve satisfactory adhesion values" (col. 3, lines 39-41). The Stow patent indicates a preference for metal particles, preferably flattened to appropriate thickness before being added to an adhesive-coating mixture, while also suggesting the use of "[m]etallized plastic or glass beads or spheres" and that "the particles can be metal alloys, or composites in which one metal is coated on another" (col. 4, lines 52-55).

The Hartman patent concerns a flexible tape that, like the adhesive layer of the Fujita patent, can adhesively make individual electrical connections between multiple pairs of electrode arrays without short circuiting electrodes of either array by means of small particles that form electrically conductive bridges extending through the thickness of the layer. Each of the particles has a ferromagnetic core and an electrically conductive surface layer such as silver.

U.S. Pat. No. 4,606,962 (Reylek et al.), like the above-discussed patents, discloses a tape that provides electrical conductivity through the thickness of an adhesive layer, and is especially concerned with adhesively attaching a semiconductor die or chip to a substrate to dissipate both heat and static electricity. The adhesive layer of the Reylek tape, which preferably is heat-activatable, contains electrically and thermally conductive particles that, at the bonding temperature of the adhesive, are at least as deformable as are substantially pure silver spherical particles. The thickness of the particles exceeds the thickness of the adhesive between particles. When the particle-containing adhesive layer is removed from the carrier layer of the transfer tape and compressed between two rigid plates, the particles are flattened to the thickness of the adhesive between particles, thus providing small, flat conductive areas at both surfaces of the adhesive layer. The particles preferably are substantially spherical and made of a metal such as silver or gold or of more than one material such as "a solder surface layer and either a higher melting metal core such as copper or a nonmetallic core" (col. 4, lines 20-21).

The Reylek patent says: "To economize the use of the electrically conductive particles, they may be located only in segments of the novel adhesive transfer tape which are to contact individual electrical conductors"- (col. 2, lines 39-42). Three techniques are given. The first as outlined at col. 2, lines 42-55 (1) forms a viscous adhesive coating, (2) renders areas of the coating substantially tack-free, (3) applies electrically conductive particles that adhere only to the viscous portions of the coating, and then (4) polymerizes the viscous areas to a substantially tack-free state. When the viscous areas remaining after step (2) are small, the electrically conductive particles are individually positioned in a predetermined pattern.

SUMMARY OF THE INVENTION

The present invention provides an adhesive tape that, like adhesive tapes of the Reylek patent, can be used to make reliable electrical connections through the thickness of its adhesive layer while being electrically insulating in lateral directions. Like the adhesive tapes of the Reylek patent, the tape of the present invention contains electrically conductive particles that preferably are substantially equiax, i.e., particles having approximately the same thickness in every direction. Hence, a substantially equiax particle has a substantially uniform diameter, whether or not it is spherical.

The adhesive tape of the invention differs from those of the Reylek patent in that electrically conductive particles of the novel tape can be much closer together without touching laterally, and this permits the novel tape to make reliable electrical connections between facing arrays of tiny, closely spaced electrical components which otherwise could be exceedingly difficult to interconnect electrically by any known method. For example, when the electrically conductive particles of the novel tape have a substantially uniform diameter of about 50 $\mu$m and the average distance between adjacent particles does not exceed their average diameter, the novel adhesive tape can interconnect facing arrays of electrical conductors which are about 100 $\mu$m in width and separated by about 100 $\mu$m, without any missed connections or shorting. When the electrically conductive particles of the novel tape are of smaller diameter, they can interconnect facing arrays of electrical conductors which are of correspondingly narrower width and spacing. Preferably the average diameter of the particles is at least 10 $\mu$m, because the average diameter should approximate the thickness of the adhesive, and it is difficult to form good bonds when the adhesive layer has a thickness less than 10 $\mu$m.

The novel tape can be made by the steps of a) applying a layer of stretchable adhesive to a biaxially stretchable sheet, b) covering the stretchable adhesive layer with a dense monolayer of electrically conductive particles, and c) biaxially stretching the adhesive-bearing sheet to separate each particle from other particles of the monolayer.

Because an adhesive which is stretchable may not have good adhesive properties, it may be desirable in step b) to embed the particles into the adhesive layer only to a small fraction of their diameters and then to carry out subsequent to step c) the added step d) of transferring the electrically conductive particles to the adhesive layer of a conventional adhesive tape which can be a transfer tape. The adhesive layer of the conventional tape should form strong bonds on contact with substrates such as may support printed circuits.

When the adhesive of the conventional tape is a pressure-sensitive adhesive and the novel tape produced at step d) is wound with a low-adhesion backing into roll form, the winding operation inherently forces the conductive particles into the pressure-sensitive adhesive layer. When the adhesive of the conventional tape is not tacky at room temperature, the tape should be warmed during step d) so that the electrically conductive particles become embedded into its adhesive layer.

Whether or not there is to be a step d), it is preferred in step b) to embed only the tips of the particles into the stretchable adhesive layer so that the particles do not interfere with the stretching in step c). When there is no step d), step c) preferably is followed by a step of further embedding the particles into the adhesive layer to ensure that they do not accidentally come loose.

When the dense monolayer of step b) is as dense as possible, each of the electrically conductive particles of the adhesive tape of the invention, after the biaxially stretching step c), will be substantially equally spaced from its six nearest neighbors. The amount of that spacing can be controlled by the extent to which the adhesive bearing sheet is stretched in step c).

Because it is difficult to obtain a completely dense monolayer of small particles, it is likely that many of the particles of the tape of the invention will have only five nearest neighbors from which it is substantially equally spaced. A few may have less than five. However, an adhesive tape of the invention can be identified in that every particle should be separated from every other particle, even when their average spacing is less than their average diameter. Prior methods for producing such close spacing inevitably result in some particles touching each other.

DETAILED DISCLOSURE

Preferably the thickness of the adhesive layer of the novel tape is from 10 to 100 $\mu$m, more preferably from 25 to 50 $\mu$m. Adhesive thicknesses above 100 $\mu$m may be uneconomical, while thicknesses below 25 $\mu$m may not provide full contact between the adhesive layer and a substrate which is not perfectly flat. When the adhesive is pressure-sensitive and is coated from solution or emulsion, it is difficult to obtain uniform coatings much greater than 50 $\mu$m.

Preferably the adhesive layer of the novel tape is pressure-sensitive either at room temperature or when warmed to moderately elevated temperatures, e.g., the adhesive of Example 1 of the above-cited Reylek patent. Also useful are hot-melt adhesives. A third class of adhesives that has been used in step a) is disclosed in U.S. Pat. No. 3,691,140 (Silver). Because the Silver adhesive has limited adhesiveness, its use should be followed by transfer of the electrically conductive particles to the adhesive layer of a more aggressively adhesive tape.

The stretchable sheet used in step a) preferably stretches uniformly in both directions, e.g., a polyester such as poly(ethyleneterephthalate) or an elastomer. A polyester can maintain the dimensions to which it is stretched and so can serve as the carrier of the novel tape. When the sheet used in step a) is an elastomer, the electrically conductive particles should be transferred to a conventional tape while the elastomeric sheet is in the stretched condition. After that transfer, the elastomeric sheet can be reused.

It may be sufficient in step c) of the novel method to stretch the adhesive-bearing sheet in only one direction, thus leaving substantially contiguous chains of particles in the other direction. When using such a tape to interconnect two arrays of parallel conductors, it would be desirable to align the chains of particles with the conductors of the array in order to ensure against shorting.

Preferred pressure-sensitive adhesives are silicones which form exceptionally strong bonds to a wide variety of surfaces, including low energy surfaces of materials that are widely used in printed circuitry, e.g., polyimide, polyethylene, polypropylene, and poly(tetrafluoroethylene). Furthermore, the bonds remain intact when exposed to large fluctuations in temperature. Especially good in these respects are siloxane pressure-sensitive adhesives such as poly(dimethylsiloxane) pressure-sensitive adhesive (Dow Corning DC 284) and phenyl-containing siloxane pressure-sensitive adhesive (GE 6574). These siloxane pressure-sensitive adhesives are so aggressively tacky that when marketed as transfer tapes, specially prepared backings are required, e.g., a biaxially oriented poly(ethyleneterephthalate) film, each surface of which has been treated to make it low-adhesion, e.g., by a coating of a perfluoropolyether polymer as disclosed in U.S. Pat. No. 4,472,480 (Olson).

Because silicone pressure-sensitive adhesives are coated from solution or emulsion, it is difficult to obtain uniform coatings greater than about 50 $\mu$m in thickness. Where thicker pressure-sensitive adhesive coatings are desired, it may be desirable either to apply multiple layers of the adhesive or to photopolymerize an adhesive in situ. For example, monomeric mixtures of alkyl acrylates and copolymerizable monomers such as acrylic acid can be copolymerized by exposure to ultraviolet radiation to a pressure-sensitive adhesive state.

Among other classes of adhesives that can be used in the novel tape are hot-melt adhesives (such as polyolefins, polyurethanes, polyesters, acrylics, and polyamides) and thermosetting adhesives (such as epoxy resins, phenolics, and polyurethanes).

An adhesive tape of the invention can be a transfer tape when it has a flexible backing, each surface of which is low-adhesion. The transfer tape can be wound upon itself into a roll and used to provide multiple electrical connections between electrodes on two substrates or used between electrical components to provide grounding, static elimination, and electromagnetic shielding in a variety of applications.

Other useful backings of the electrically conductive adhesive tape of the invention include flexible webs to which the particle-containing adhesive layer is permanently adhered, e.g., an electrically conductive web such as a metal foil or an electrically insulative web bearing electrically conductive elements such as parallel metal strips. For example, a metal foil-backed pressure-sensitive adhesive tape of the invention can be used to provide an electrical connection across a seam between two abutting electrically conductive panels such as may be used as part of an electromagnetically shielded enclosure.

For most uses, the electrically conductive particles should be equiax and their average diameter should be from 5 to 50% greater than the thickness of the adhesive layer between particles. When the novel adhesive tape is used for electrically connecting two arrays of tiny metal electrodes or pads which are slightly raised above the adjacent surfaces, the application of ordinary hand pressure can cause the adhesive to flow into the depressions between the electrodes, thus permitting the diameters of the particles to be somewhat less than the original thickness of the adhesive layer.

The electrically conductive particles of the adhesive tape of the invention can be identical to those of the Reylek patent, that is, as deformable as substantially pure silver particles. When the backing of a tape containing such particles containing adhesive layer can be removed, the adhesive layer can be employed to adhere two electrode-bearing substrates together. Upon compressing the resulting composite between rigid plates, the electrically conductive particles are partially flattened, thus providing good electrical conductivity between the electrodes of the two substrates as well as good thermal conductivity when desired.

Instead of being flattenable, the electrically conductive particles of the novel tape can be hard relative to the electrodes of two substrates to be electrically interconnected and so can penetrate into the electrodes. To attain sufficient penetration, the particles preferably have a Knoop Hardness Value (ASTM Test Method E384-84 using the Knopp indenter) of at least 300. This penetration is believed to perform a sort of wiping action, removing oxides and other surface contamination and thereby creating a metallurgically and electrically superior connection. When hard electrically conductive particles are substantially spherical, each forms a tiny crater in any electrode or other conductive element of the substrate to which the tape is applied under hand pressure. The formation of a crater assures good electrical connection as well as good thermal conductivity when desired.

The electrically conductive particles of the novel tape may have cores that need not be electrically conductive when they have electrically conductive surface layers. An especially useful particle is a glass bead having an electrically conductive surface layer such as a metallic coating that preferably is only thick enough to provide the desired electrical conductivity, e.g., from 0.1 to 2 $\mu$m. Other useful core materials include other ceramics, steel, nickel, and work-hardened copper.

A gold surface layer may be economical only when its thickness is about 0.1% or less of the thickness of the core of the particle. Other useful metal surface layers include silver, copper, aluminum, tin and alloys thereof.

When the particles are metal or have metallic surface layers, the novel tape is both electrically and thermally conductive through its adhesive layer and so is useful for applications requiring thermal conductivity.

THE DRAWING

The invention may be more understandable by reference to the drawing in which.

In the examples, all parts are given by weight.

EXAMPLE 1

Poly(ethyleneterephalate) film was cast to a thickness of 0.25 mm and dip-coated with a dilute solution prepared as follows:

20 ml of [25 parts of a copolymer of 95.5 parts isooctyl acrylate and 4.5 parts acrylic acid in 30 parts heptane:isopropanol] diluted with 140 ml of methylethylketone.

The coated film was hung vertically and allowed to dry. The thickness of the resulting pressure-sensitive adhesive coating was too thin to measure with a micrometer. Spherical glass beads of substantially uniform diameter (about 50 $\mu$m), each having a silver surface layer of about 0.5 $\mu$m thickness, were poured onto the surface of the thin adhesive coating and spread about with a hand-held roller in an attempt to form a closed-packed monolayer of the silvered beads.

Figure 1:
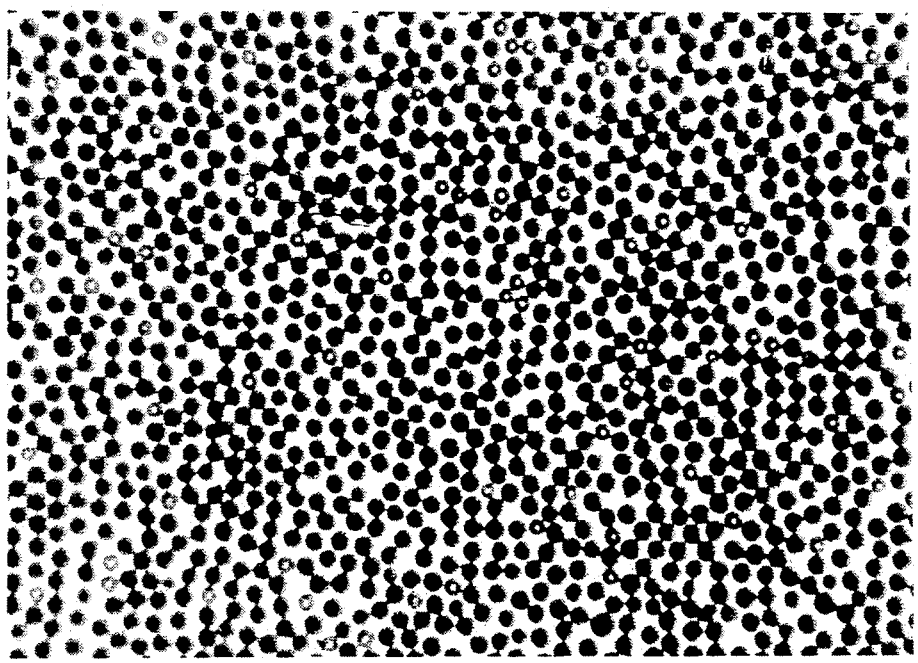
FIG. 1 is a photomicrograph at 50X of a fragment of the exposed surface of a pressure-sensitive adhesive sheet to which silvered glass beads are lightly tacked.

FIG. 1 of the drawing shows that a monolayer was attained, but that there were many spaces between beads. Almost all of the spaces were too small to receive a bead.

Figure 2:
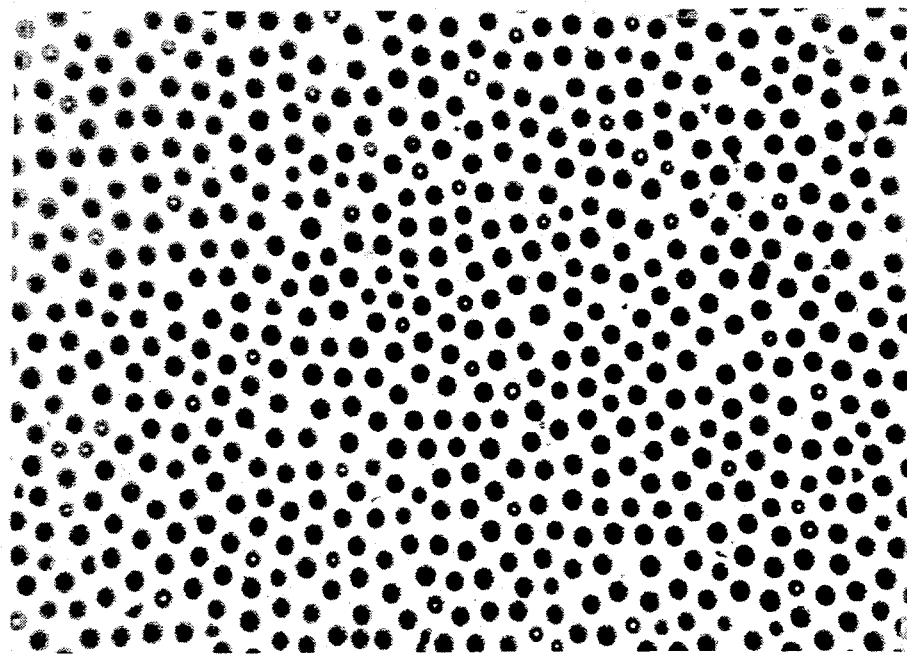
FIG. 2 is a photomicrograph at 50X of a fragment of the pressure-sensitive adhesive sheet of FIG. 1 after the sheet has been biaxially stretched as described in Example 1.

The coated polyester was then cut into sections. After being heated for 2.5 minutes, each section was stretched at 104° C. in a T. M. Long film stretching apparatus from a square 10 cm on a side to a square 17.5 cm on a side. A photomicrograph of a central portion of one of the stretched sections is shown in FIG. 2 of the drawing. It appears from the photomicrograph that every bead is spaced from every other bead. There also appear to be one or two doubtlet beads and an occasional piece of broken glass.

Most of the beads seen in FIG. 2 have six nearest neighbors, i.e., six beads from which each is almost uniformly spaced. Some of the beads have five nearest neighbors from which a bead is substantially uniformly spaced. A few are rather randomly spaced from their nearest neighbors.

EXAMPLE 2

Using a hand iron, the silvered beads on the stretched polyester film of Example 1 were transferred to a 50-$\mu$m layer of phenyl-containing siloxane pressure-sensitive adhesive (GE 6574) tape. The back of the tape was a 60-$\mu$m biaxially oriented poly(ethyleneterephthalate) film having a low-adhesion backsize coating of a perfluoropolyether polymer as disclosed in U.S. Pat. No. 4,472,480 (Olson). The transfer was effected by laying the siloxane adhesive layer over the silvered beads and pressing the beads into the adhesive by running a hand-roller over the backing of the siloxane tape. All of the beads transferred, thus providing an electrically conductive pressure-sensitive adhesive transfer tape of the invention.

This particle-bearing transfer tape was used to adhere a flexible printed circuit (on "Kapton" polyimide film obtained from E. I. du Pont) to a rigid printed circuit board. At the face of each of the flexible and rigid printed circuits was a series of parallel solder-coated copper electrode strips, each 0.5 mm in width and spaced 0.5 mm apart. With the electrode strips of the printed circuits aligned, they were bonded together by a piece of the adhesive transfer tape which was 0.635 cm wide in the lengthwise direction of the electrode strips. The bonding was made in a press at 179° C. for 30 seconds under a pressure of about 1400 kPa.

Of the 17 electrode pairs thus interconnected, the ohmic resistance of each of the central 15 pairs was tested at room temperature by applying a DC current of 0.1 milliamperes at less than 1.2 volts, both initially and after storage at 100° C. The ohmic resistances reported in Table I are twice the resistance per connection since the circuit extends through two pieces of the adhesive tape of Example 2.

TABLE I

| Connection No. | Resistance in ohms (after indicated hours of storage at 100° C.) | | |
|---|---|---|---|
| | 0.0 | 96.7 | 234.4 |
| 1 | 0.7 | 8.6 | 2.0 |
| 2 | 0.2 | 3.7 | 1.9 |
| 3 | 0.3 | 1.5 | 1.6 |
| 4 | 0.2 | 5.5 | 4.8 |
| 5 | 0.3 | 2.4 | 4.8 |
| 6 | 0.7 | 7.0 | 2.4 |
| 7 | 0.4 | 3.8 | 2.5 |
| 8 | 0.4 | 2.5 | 5.5 |
| 9 | 0.4 | 2.3 | 3.2 |
| 10 | 0.4 | 1.4 | 4.1 |
| 11 | 0.3 | 7.7 | 1.5 |
| 12 | 0.4 | 2.8 | 2.6 |
| 13 | 0.3 | 1.3 | 2.3 |
| 14 | 0.2 | 1.0 | 3.8 |
| 15 | 0.3 | 2.7 | 3.8 |

EXAMPLE 3

The silvered beads of the stretched polyester film of Example 1 were transferred to the thermosetting adhesive layer of a transfer tape, the carrier of which was biaxially oriented poly(ethyleneterephthalate) film 50 μm in thickness and having a low-adhesion surface treatment. The thermosetting adhesive layer had been made by mixing together 25 parts of PKHC, a phenoxy resin from the Union Carbide Corporation, 55 parts of Quatrex 1010, a diglycidyl ether of bisphenol A epoxy resin from the Dow Chemical Company, and 38 parts of 9,9-bis(3-methyl-4-aminophenyl) fluorene (hereinafter BAFOT). The first two of these three constituents were stirred to a uniform paste, using methylethylketone (MEK) as a solvent for the solution of the phenoxy and epoxy resins, followed by blending in the relatively insoluble BAFOT, and dilution of the resultant paste to 50% solids by weight with additional MEK. The BAFOT fluorene-amine curative was prepared for dispersion in this epoxy resin system by jet milling to a mean particle size of <5 μm. To this dispersion were added 4 parts of an accelerator, the triflic acid half salt of 2-ethyl-4-methylimidazole and 1.26 parts of an adhesion promoter, hydrolyzed (3-glycidoxypropyl)trimethoxysilane. The epoxy adhesive system was coated onto the carrier from this 50% solids by weight dispersion. The coating was applied by knife coater at room temperature, followed by air drying for 30 minutes, and one minute drying at 80° C. in a forced air oven. The dry coating thickness was about 25 μm.

The transfer was accomplished using a hand-held iron having a surface temperature of 75° C. in order to embed the silvered beads into the thermosetting adhesive layer. All of the silvered beads transferred, thus providing a thermosetting adhesive transfer tape of the invention. This tape was used and tested in the same way as in Example 2 except that the bonding was at 280° C. and the conditions of storage were 60° C., 95% relative humidity. Results are in Table II.

TABLE II

| Connection No. | Resistance in Ohms (after indicated hours of storage) | | |
|---|---|---|---|
| | 0.0 | 96.6 | 234.3 |
| 1 | 0.1 | 0.1 | 0.2 |
| 2 | 0.1 | 0.1 | 0.2 |
| 3 | 0.1 | 0.1 | 0.2 |
| 4 | 0.1 | 0.1 | 0.2 |
| 5 | 0.1 | 0.1 | 0.2 |
| 6 | 0.1 | 0.1 | 0.1 |
| 7 | 0.1 | 0.1 | 0.1 |
| 8 | 0.1 | 0.2 | 0.2 |
| 9 | 0.1 | 0.1 | 0.1 |
| 10 | 0.1 | 0.1 | 0.1 |
| 11 | 0.1 | 0.2 | 0.1 |
| 12 | 0.1 | 0.2 | 0.1 |
| 13 | 0.1 | 0.1 | 0.1 |
| 14 | 0.1 | 0.2 | 0.1 |
| 15 | 0.1 | 0.2 | 0.1 |

EXAMPLE 4

An adhesive film of a copolymer of ethylene and acrylic acid (EAA), approximately 25 μm in thickness and on a carrier of 50 μm polyester film, was hot laminated to a cast poly(ethyleneterephthalate) polyester film of 250 μm thickness using a lab laminator which had one rubber roll and one metal roll, both at 100° C. The laminate was cut into squares 11.11 cm on a side, and the carrier was removed to expose the EAA adhesive. Because the cast polyester film was to be clamped in a film stretcher, the EAA was removed from the edges of the squares. The EAA adhesive was then flood coated with nickel-coated phenolic beads (Bell Pearl N-800 available from Kanebo, Japan) which were about 20 μm in diameter. The beads were partially embedded in the EAA adhesive by means of a hand-held rubber roller. Excess particles were tapped off leaving a fairly closed-packed monolayer of electrically conductive particles.

Figure 3:
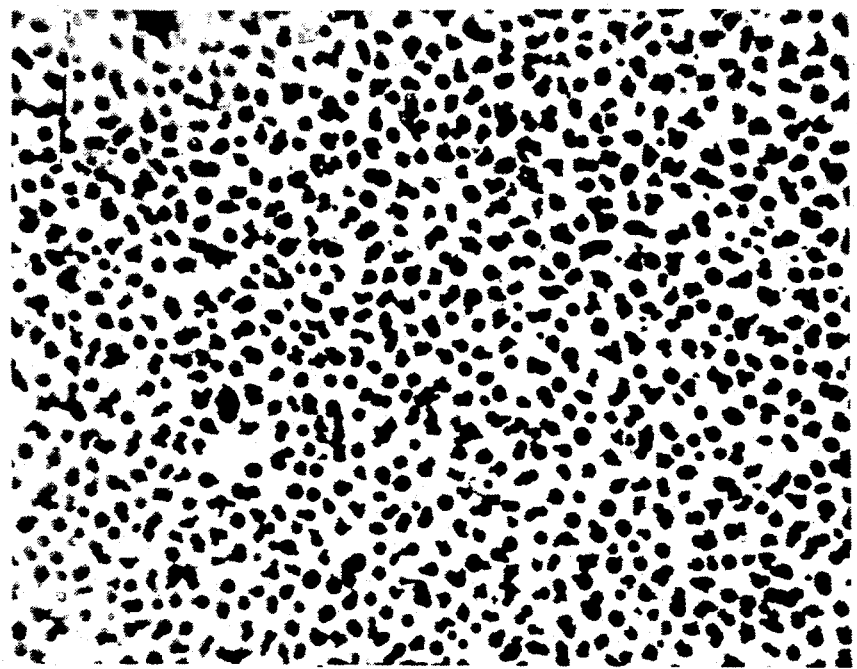
FIG. 3 is a photomicrograph at 100X of a fragment of the exposed surface of a hot-melt adhesive sheet in which electrically conductive particles are partially embedded.
Figure 4:
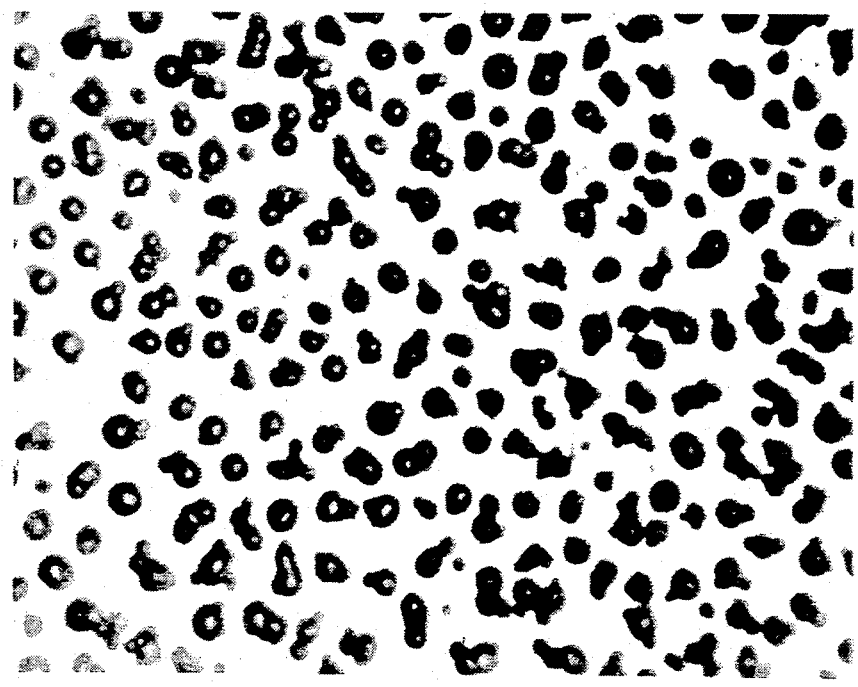
FIG. 4 is a photomicrograph at 200X of a fragment of the exposed surface of the adhesive sheet shown in FIG. 3.

One of the squares was clamped in a T. M. Long film stretching apparatus such that the unclamped region was a square 10.16 cm on a side. While at 100° C., the 10.16 cm square section was stretched to a 13.97 cm square section. Photomicrographs at magnifications of 100× and 200× are reproduced in FIGS. 3 and 4, respectively, of the drawing.

Because some of the electrically conductive beads of this example were doublets and triplets, some of the particles appear to be as great as about 80μm in length. Hence, to avoid shorting, the adhesive tape of this example should be used where adjacent conductors are spaced from each other by at least 100 μm. Preferably, electrically conductive beads are employed, all of which are singlets, in which event the adhesive tape could be used for interconnecting conductors 50 μm wide with 50 μm spacing without any hazard of either shorting or missed connections.

The method of the invention can be used to make products other than electrically conductive adhesive tape. For example, by substituting abrasive particles for electrically conductive particles in the above-outlined 3-step method, one can produce open-coat abrasive sheeting having equally spaced abrasive particles. This not only provides extraordinarily uniform abrasive action, but the spaces inhibit clogging.

The method also can be used to position particles such as glass beads on the surface of a tacky adhesive layer to prevent the adhesive from bonding to a surface to which it is applied until it has been correctly positioned. When the diameter of the beads is less than the thickness of the adhesive, the adhesive can then be pressed against the surface, thus completely embedding the beads into the adhesive layer to create a strong bond between the adhesive layer and the surface. When the beads are glass microbubbles having thin walls, they can be fractured by the pressing action.

We claim:

1. Adhesive tape comprising a backing carrying an adhesive layer of substantially uniform thickness containing a monolayer of laterally spaced, electrically conductive particles, most of which are about equal to or somewhat larger than the adhesive thickness, thus making the adhesive layer electrically conductive through its thickness and electrically insulating laterally, wherein the improvement comprises:
   most of said particles have about six near neighbors from which each is substantially equally spaced.

2. Adhesive tape as defined in claim 1 wherein said particles are equiax.

3. Adhesive tape as defined in claim 2 wherein said particles are of substantially uniform diameter.

4. Adhesive tape as defined in claim 3 wherein said particles have a Knoop Hardness Value of at least 300 so that when substrates comprising electrically conductive elements are adhered together with a piece of the tape, the particles penetrate those elements upon application of ordinary hand pressure.

5. Adhesive tape as defined in claim 4 wherein said adhesive is a pressure-sensitive adhesive, and both the diameter of the equiax particles and the thickness of the adhesive layer are within the range of 10 to 50 μm.

6. Adhesive tape as defined in claim 2 wherein the average spacing between said equiax particles does not exceed their average diameter.

7. Adhesive tape as defined in claim 1 wherein said particles are at least as deformable as are substantially pure silver particles.

8. Adhesive tape as defined in claim 1, the adhesive of which is a pressure-sensitive adhesive and the backing of which is a disposable carrier web, each surface of which is low-adhesion.

9. Adhesive tape as defined in claim 8 wherein the pressure-sensitive adhesive is a silicone.

10. Adhesive tape comprising a backing carrying an adhesive layer of substantially uniform thickness containing a monolayer of laterally spaced, electrically conductive particles, most of which are about equal to or somewhat larger than the adhesive thickness, thus making the adhesive layer electrically conductive through its thickness and electrically insulating laterally, wherein the improvement comprises:
    almost all of said particles are substantially equiax and of substantially the same diameter not greater than 100 μm,
    the average spacing between particles does not exceed their average diameter,
    each particle is spaced from every other particle, and
    most of said particles have about six near neighbors from which each is substantially equally spaced.

11. Adhesive tape as defined in claim 10 wherein the average diameter of the particles is between 10 and 50 μm.

* * * * *